(12) United States Patent
Nishimura

(10) Patent No.: US 10,157,911 B2
(45) Date of Patent: Dec. 18, 2018

(54) SEMICONDUCTOR DEVICE

(71) Applicant: FUJI ELECTRIC CO., LTD., Kanagawa (JP)

(72) Inventor: Takeyoshi Nishimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/636,674

(22) Filed: Jun. 29, 2017

(65) Prior Publication Data

US 2018/0047722 A1 Feb. 15, 2018

(30) Foreign Application Priority Data

Aug. 10, 2016 (JP) ................................ 2016-157328

(51) Int. Cl.
| | |
|---|---|
| *H01L 29/06* | (2006.01) |
| *H01L 29/40* | (2006.01) |
| *H01L 29/78* | (2006.01) |
| *H01L 27/06* | (2006.01) |
| *H01L 29/423* | (2006.01) |

(52) U.S. Cl.
CPC ...... *H01L 27/0629* (2013.01); *H01L 29/0634* (2013.01); *H01L 29/0696* (2013.01); *H01L 29/402* (2013.01); *H01L 29/4236* (2013.01); *H01L 29/7803* (2013.01)

(58) Field of Classification Search
CPC ..... H01L 27/0629; H01L 27/24; H01L 27/06; H01L 29/4236; H01L 29/0696; H01L 29/0634; H01L 29/402; H01L 29/0619; H01L 29/7788; H01L 29/7803; H01L 29/63
See application file for complete search history.

(56) References Cited

U.S. PATENT DOCUMENTS

| | | | |
|---|---|---|---|
| 2011/0012195 A1 | 1/2011 | Momota et al. | |
| 2011/0198587 A1 | 8/2011 | Takeuchi | |
| 2011/0309810 A1* | 12/2011 | Willmeroth | H02M 1/36 323/282 |
| 2012/0007139 A1 | 1/2012 | Tanaka | |

(Continued)

FOREIGN PATENT DOCUMENTS

| | | |
|---|---|---|
| JP | H08-046193 A | 2/1996 |
| JP | 2010-219258 A | 9/2010 |

(Continued)

*Primary Examiner* — Galina Yushina

(57) ABSTRACT

In a semiconductor device having an SJ structure, the reverse breakdown voltage decrease is suppressed while a main body region and a current detecting region are separated. Provided is a semiconductor device that has a semiconductor substrate, a main body region including one or more operation cells formed inside the semiconductor substrate, a current detecting region including one or more current detecting cells formed inside the semiconductor substrate, and an intermediate region that is provided between the main body region and the current detecting region and inside the semiconductor substrate and that includes an edge termination structure unit. A first conductivity-type column and a second conductivity-type column are alternately arranged at equal intervals in the main body region, the current detecting region, and the intermediate region.

8 Claims, 6 Drawing Sheets

(56) References Cited

U.S. PATENT DOCUMENTS

| | | | |
|---|---|---|---|
| 2012/0112241 A1 | 5/2012 | Matsushita | |
| 2012/0211833 A1* | 8/2012 | Tamura | H01L 29/7815 257/339 |
| 2014/0015046 A1* | 1/2014 | Thiele | H01L 23/58 257/334 |
| 2014/0084361 A1 | 3/2014 | Saito | |
| 2015/0380400 A1* | 12/2015 | Jonishi | H01L 21/823878 257/369 |

FOREIGN PATENT DOCUMENTS

| | | |
|---|---|---|
| JP | 2011-171478 A | 9/2011 |
| JP | 2013-055361 A | 3/2013 |
| JP | 2014-063907 A | 4/2014 |

* cited by examiner

US 10,157,911 B2

SEMICONDUCTOR DEVICE

The contents of the following Japanese patent application (s) are incorporated herein by reference:
NO. 2016-157328 filed in JP on Aug. 10, 2016

BACKGROUND

1. Technical Field

The present invention relates to semiconductor devices.

2. Related Art

Conventionally, in semiconductor devices such as an IGBT (Insulated Gate Bipolar Transistor), structures including a main body region to drive as an element and a current detecting region for detecting a current have been known (for example, see Patent Document 1).

Patent Document 1: Japanese Patent Application Publication No. 2010-219258

The current detecting region is in some cases surrounded by an edge termination structure such as a field plate. When a super-junction structure is formed in the main body region and the current detecting region in a device including the edge termination structure, the reverse breakdown voltage decreases in some cases due to the charge balance being lost between p-type and n-type impurities in the super-junction structure.

SUMMARY

According to a first aspect of the present invention, provided is a semiconductor device including a semiconductor substrate. The semiconductor device may include a main body region including one or more operation cells formed inside the semiconductor substrate. The semiconductor device may include a current detecting region including one or more current detecting cells formed inside the semiconductor substrate. The semiconductor device may include an intermediate region that is provided between the main body region and the current detecting region and inside the semiconductor substrate and that includes an edge termination structure unit. In the main body region, the current detecting region, and the intermediate region, a first conductivity-type column and a second conductivity-type column may alternately be arranged at equal intervals.

The intermediate region may include a field plate formed above the semiconductor substrate. In the intermediate region, a diode portion may be formed in a region adjacent to the main body region and in a region adjacent to the current detecting region.

Inside the semiconductor substrate, a first conductivity-type base region and a second conductivity-type drift region formed below the base region may be formed. The main body region and the current detecting region may include a plurality of trench portions that are formed to extend from an upper surface of the semiconductor substrate to below the base region and arranged at the same intervals. The main body region and the current detecting region may include a second conductivity-type high concentration region formed above the base region in a region between the respective trench portions. A high concentration region may not be formed in the intermediate region.

The diode portion adjacent to the main body region and the diode portion adjacent to the current detecting region may share a base region. The diode portion adjacent to the main body region and the diode portion adjacent to the current detecting region may include the base regions separate from each other. The intermediate region may further include, between the base region in the diode portion adjacent to the main body region and the base region in the diode portion adjacent to the current detecting region, a base region separate from the other base regions.

The semiconductor device may include an upper surface side electrode formed above at least part of the main body region. The semiconductor device may include a current detecting electrode formed above at least part of the current detecting region. The diode portion adjacent to the main body region may be connected to the upper surface side electrode. The diode portion adjacent to the current detecting region may be connected to the current detecting electrode. The first conductivity-type column and the second conductivity-type column may be of the same impurity concentration in the main body region, the current detecting region, and the intermediate region.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims. Also, all the combinations of the features described in the embodiment(s) are not necessarily essential to means provided by aspects of the invention.

One side in a direction parallel to the depth direction of a semiconductor substrate is referred to as the 'upper' side, and the other side is referred to as the 'lower' side herein. Out of two principal surfaces of a substrate, a layer, or some other member, one of the surfaces is referred to as the upper surface, and the other surface is referred to as the lower surface. The 'upper' and 'lower' directions are not limited to the gravity direction.

Although the terms 'source' and 'drain' are used herein, the semiconductor device is not limited to a MOSFET. The 'emitter' and 'collector' in a bipolar transistor of an IGBT or the like may also be included in the scope of the terms 'source' and 'drain' used herein.

Although in each embodiment, the first conductivity-type and the second conductivity-type are illustrated as a p-type and an n-type, respectively, the conductivity-types of the substrate, the layer, the region, or the like may each be of opposite polarity.

Figure 1:
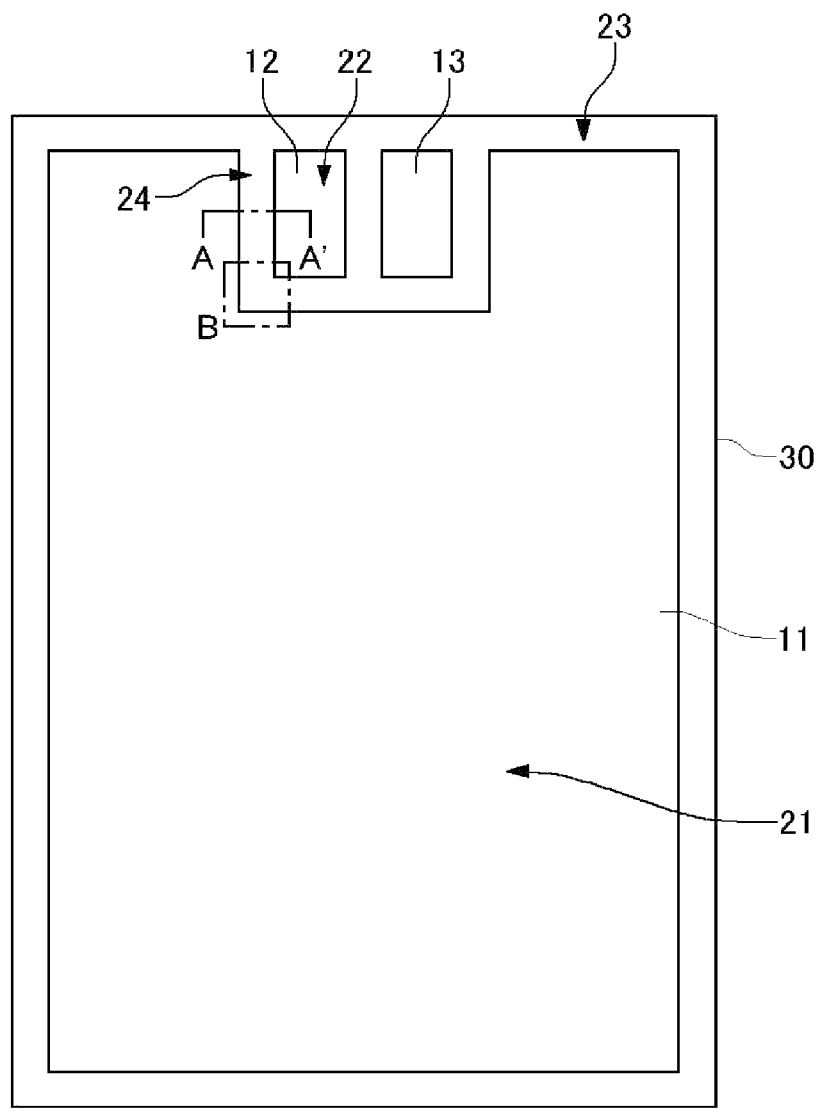
FIG. 1 is a schematic view of an upper surface of a semiconductor device 100 according to an embodiment of the present invention.

FIG. 1 is a schematic view of an upper surface of a semiconductor device 100 according to an embodiment of the present invention. The semiconductor device 100 includes a semiconductor substrate 30. The semiconductor substrate 30 may be a silicon substrate or a compound-semiconductor substrate formed of nitride semiconductor, silicon carbide, or the like. A source electrode 11 and a current detecting electrode 12 are formed above the upper surface of the semiconductor substrate 30. The source electrode 11 is one example of the upper surface side electrode. A gate electrode 13 may be further formed above the upper surface of the semiconductor substrate 30.

As one example, the source electrode 11, the current detecting electrode 12, and the gate electrode 13 are formed of metal materials such as aluminum, aluminum alloy, copper, or copper alloy. The source electrode 11, the current detecting electrode 12, and the gate electrode 13 are provided separately from each other. The semiconductor device 100 of the present example is a vertical device in which the main current flows in the depth direction of the semiconductor substrate 30. A drain electrode is formed on the lower surface of the semiconductor substrate 30 of the present example.

A main body region 21, a current detecting region 22, and an intermediate region 24 are formed inside the semiconductor substrate 30. The main body region 21 is a region where the main current for the semiconductor device 100 flows. The main current that flows into the main body region 21 flows to the outside via the source electrode 11. The source electrode 11 is formed above at least part of the main body region 21.

The current detecting region 22 is a region where a detection target current flows. The detection target current flows into an external current detecting device via the current detecting electrode 12. The current detecting electrode 12 is formed above at least part of the current detecting region 22. On the upper surface of the semiconductor substrate 30, the area covered by the current detecting electrode 12 is smaller than the area covered by the source electrode 11.

The current detecting device detects a current value of the detection target current. The current detecting device may control the semiconductor device 100 based on the detected current value. For example, the current detecting device controls the semiconductor device 100 to be turned off if the detected current value exceeds a predetermined threshold value.

The intermediate region 24 is provided between the main body region 21 and the current detecting region 22, thereby separating them. An edge termination structure such as a field plate is provided in the intermediate region 24.

An edge termination structure region 23 may be formed along the outer periphery of the semiconductor substrate 30. The edge termination structure region 23 is formed outside the main body region 21, the current detecting region 22, and the intermediate region 24. The edge termination structure such as a guard ring or a field plate is formed in the edge termination structure region 23. The intermediate region 24 may have a structure similar to that of the edge termination structure region 23.

Figure 2:
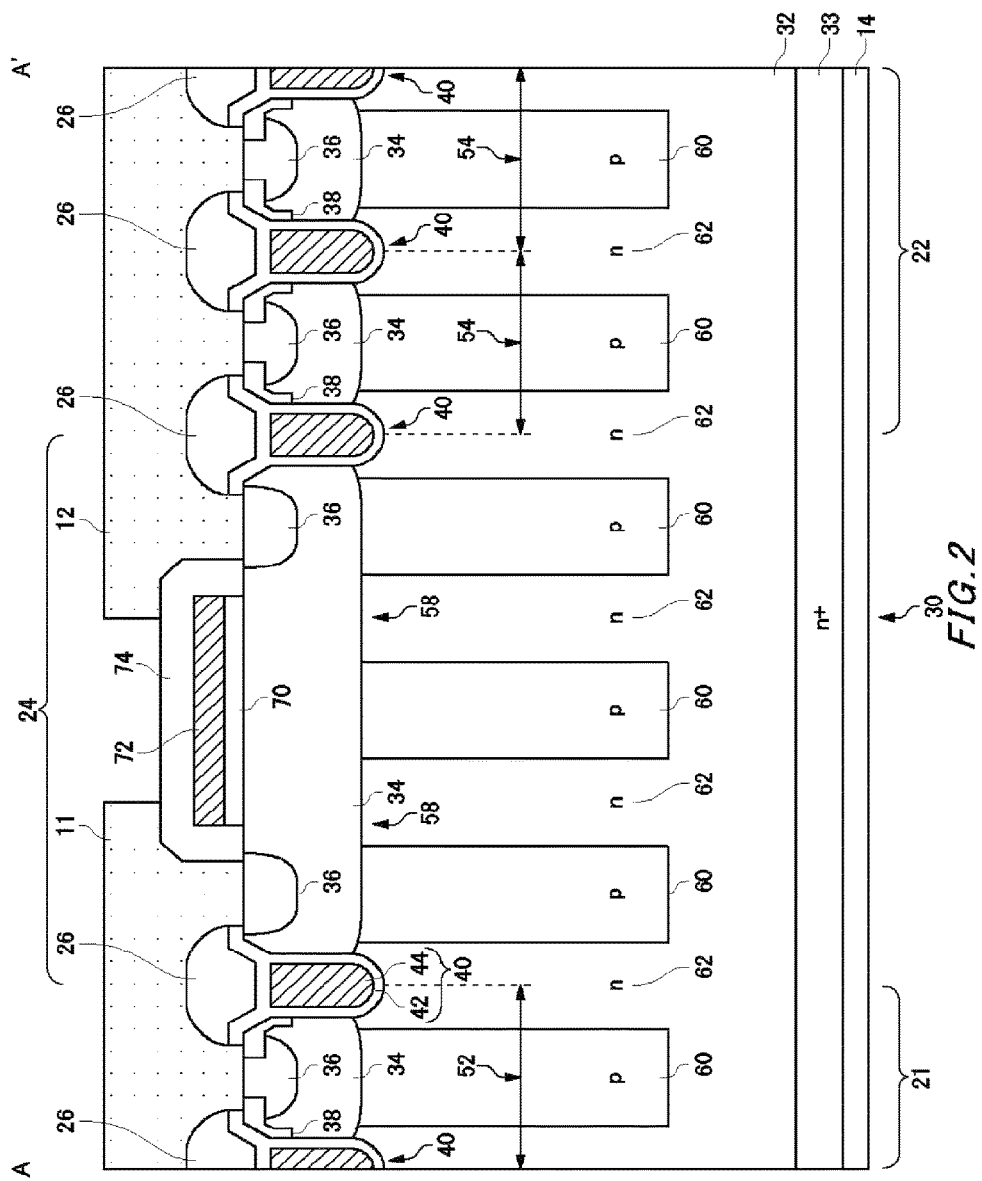
FIG. 2 shows an example of the cross section A-A' in FIG. 1.

FIG. 2 shows one example of the cross section A-A' in FIG. 1. Each structure shown in FIG. 2 may be formed to extend in a direction perpendicular to the sheet surface of FIG. 2. In FIG. 2, as one example, an n$^+$-type drain region 33 doped with n-type impurities and a drain electrode 14 are formed at the lower surface side of the semiconductor device 100.

One or more operation cells 52 where a main current flows are formed in the main body region 21. One or more current detecting cells 54 where a detection target current flows are formed in the current detecting region 22. The operation cell 52 and the current detecting cell 54 of the present example function as transistors that switch whether or not to cause a current to flow in a depth direction of the semiconductor substrate 30. The operation cell 52 and the current detecting cell 54 preferably have the same structure and the same impurity concentration.

On the upper surface of the semiconductor substrate 30, the area occupied by the current detecting region 22 is smaller than the area occupied by the main body region 21. The area occupied by the current detecting region 22 may be equal to or less than one tenth, or may also be equal to or less than one hundredth, of the area occupied by the main body region 21.

The intermediate region 24 is formed between the main body region 21 and the current detecting region 22 and inside the semiconductor substrate 30. The intermediate region 24 includes a field plate 72 and the like, surrounding the current detecting region 22.

Inside the semiconductor substrate 30 in the intermediate region 24, a trench portion 40, the operation cell 52, and the current detecting cell 54 are not formed. In the present example, a region that operates as a transistor is not formed in the intermediate region 24. In the intermediate region 24 of the present example, a diode portion 58 is formed at least in a region adjacent to the main body region 21 and a region adjacent to the current detecting region 22.

The diode portion 58 adjacent to the main body region 21 is electrically connected to the source electrode 11. The diode portion 58 adjacent to the current detecting region 22 is electrically connected to the current detecting electrode 12. Also, the respective diode portions 58 share the base region 34.

In the semiconductor substrate 30 of the present example, the n$^+$-type drain region 33 and an n$^-$-type drift region 32 are formed in this order from the lower surface side in the main body region 21, the current detecting region 22, and the intermediate region 24. Also, the p-type base region 34 is formed in the surface layer of the drift region 32. Furthermore, formed in the main body region 21 and the current detecting region 22 is the trench portion 40 that penetrates the base region 34 and extends from the upper surface of the semiconductor substrate 30 to below the base region 34 and reaches the drift region 32.

A mesa region sandwiched by the respective trench portions 40 functions either as the operation cell 52 or the current detecting cell 54. In the present example, the center of the width of the trench portion 40 in the lateral direction is set to be the border between the respective cells. In the operation cell 52 and the current detecting cell 54 of the present example, an n$^+$-type source region 38 is formed above the base region 34. The source region 38 is doped with impurities at higher concentration than the drift region 32. The source region 38 is one example of a high concentration region. Then, the operation cell 52 and the current detecting cell 54 function as transistors. In the present example, out of the cells that function as transistors, the cell formed below the source electrode 11 is used as the operation cell 52, and the cell formed below the current detecting electrode 12 is used as the current detecting cell 54.

In contrast, in the intermediate region 24, the source region 38 is not formed above the base region 34. The base region 34 in the intermediate region 24 functions as a diode forming a pn-junction with the drift region 32 (an n-type column 62). The intermediate region 24 separates the main body region 21 and the current detecting region 22, thereby allowing highly precise detection of a detection target current.

Furthermore, in the operation cell 52 and the current detecting cell 54, a p+-region 36 of p+-type may be formed in an exposed region of the upper surface of the semiconductor substrate 30. The p+-region 36 is doped with impurities at higher concentration than the base region 34. Consequently, contact resistance between each of the cells and an electrode such as the source electrode 11 can be reduced. Also, the base region 34 in the intermediate region 24 includes a region located below the source electrode 11 and a region located below the current detecting electrode 12. The p+-region 36 may be formed in the region which is part of the base region 34 and is located below each of the electrodes. Consequently, contact resistance between the base region 34 and the source electrode 11 or the like can be reduced, and thereby operation of a parasitic bipolar transistor in the transistor cell can be suppressed.

The field plate 72 is formed above the base region 34 in the intermediate region 24. The field plate 72 is formed of polysilicon doped with impurities are added, for example. An insulating film 70 thicker than a gate insulating film 42 is formed between the field plate 72 and the upper surface of the semiconductor substrate 30. Moreover, an interlayer insulating film 74 covering the field plate 72 is further formed.

The field plate 72 may be given the same electric potential as the source electrode 11 or the gate electrode (electrode unit 44). By providing an edge termination structure such as the field plate 72 in the intermediate region 24 in a way to surround the current detecting region 22, electric field concentration near the intermediate region 24 can be mitigated.

The trench portion 40 of the present example includes a trench that extends from the upper surface of the semiconductor substrate 30 and reaches the drift region 32, the gate insulating film 42 formed on the inner wall of the trench, and the electrode unit 44 provided in the trench and covered with the gate insulating film 42.

As one example, the gate insulating film 42 is an oxidized film formed by thermally oxidizing the semiconductor substrate 30 exposed to the inner wall of the trench. As one example, the electrode unit 44 is formed of polysilicon and the like doped with impurities. The electrode unit 44 of the present example is electrically connected to the gate electrode 13 shown in FIG. 1. A channel is formed in the base region 34 facing the electrode unit 44, corresponding to a gate voltage applied to the electrode unit 44. Accordingly, current flows between the drift region 32 and the source region 38 in the operation cell 52 and the current detecting cell 54. Note that the electrode unit 44 and the field plate 72 may be formed simultaneously.

When the semiconductor device 100 includes an IGBT, some of the electrode units 44 may be electrically connected to the source electrode 11 (an emitter electrode in the IGBT). The trench portion 40 connected to the source electrode 11 functions as a dummy trench. This produces carriers injection enhancement effect (IE Effect), thereby lowering ON state voltage.

The respective trench portions 40 are arranged at the same intervals in the operation cell 52 and the current detecting cell 54 of the cross section. The plurality of trench portions 40 may be formed to extend in stripe shapes in the direction perpendicular to the cross section.

Part of the gate insulating film 42 is formed on the upper surface of the semiconductor substrate 30. However, the p+-region 36 and the source region 38 in each of the respective cells are at least partially not covered with the gate insulating film 42.

The interlayer insulating film 26 is formed on the upper surface of the semiconductor substrate 30 and the upper surface of the gate insulating film 42. However, an opening is formed in the interlayer insulating film 26 so that the p+-region 36 and the source region 38 in each of the cells are exposed. These openings are filled with the source electrode 11 or the current detecting electrode 12.

In the drift region 32 of the main body region 21, the current detecting region 22, and the intermediate region 24, a p-type column 60 and the n-type column 62 are alternately arranged at equal intervals. The impurity concentration and the width of the column 60 and the column 62 are adjusted so that a superjunction can be formed. Such a structure allows a depletion layer to spread in the lateral direction from the border between the column 60 and the column 62, so that the high reverse breakdown voltage can be maintained even when the impurity concentration is increased in the n-type region and ON-state resistance is lowered.

In the present example, the column 60 is formed to protrude downward from the lower surface of the base region 34 in each region. The drift region 32 between the columns 60 functions as the column 62. The interval between the respective columns 60 is equal to the interval between the cells. The column 60 is formed for each of the operation cell 52 and the current detecting cell 54. Furthermore, also at the lower side of the base region 34 in the intermediate region 24, the columns 60 are formed at the same intervals as in the main body region 21 and the current detecting region 22. The plurality of columns 60 may extend from the lower surface of one base region 34 in the intermediate region 24.

In the semiconductor device 100, the columns 60 and the columns 62 are arranged at the same intervals in the main body region 21, the current detecting region 22, and the intermediate region 24. Consequently, a superjunction of the same structure can be formed in the main body region 21, the current detecting region 22, and the intermediate region 24. The impurity concentration in the respective columns of superjunction in the main body region 21, the current detecting region 22, and the intermediate region 24 is the same.

Such a structure allows the columns 60 and the columns 62 of superjunction to be arranged at equal intervals while providing the intermediate region 24 separating the main body region 21 and the current detecting region 22. Accordingly, the charge balance between the p-type and n-type impurities in the superjunction can easily be kept, and the reverse breakdown voltage can be maintained.

Figure 3:
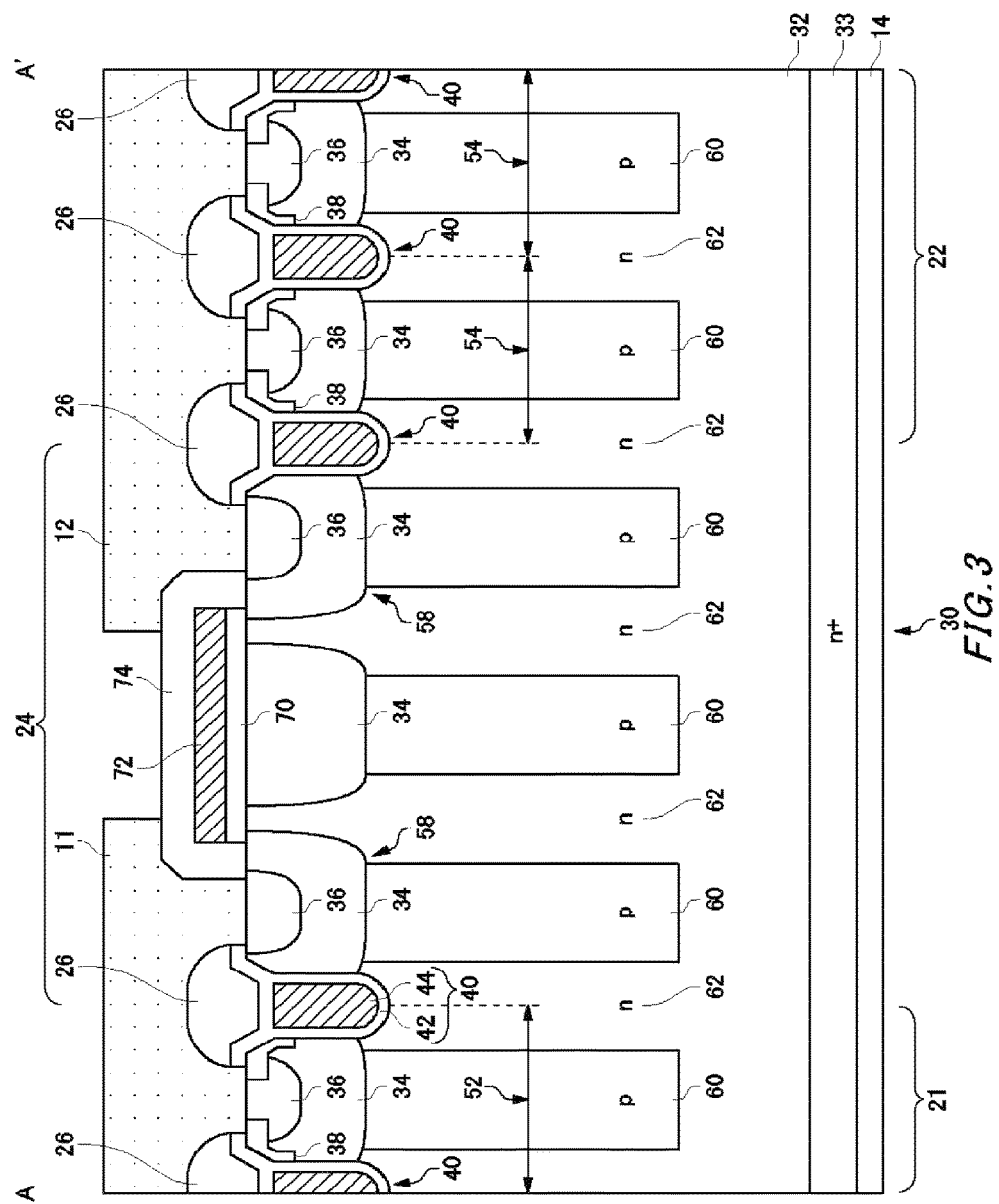
FIG. 3 shows another example of the cross section A-A' in FIG. 1.

FIG. 3 shows another example of the cross section A-A' in FIG. 1. In the present example, the plurality of base regions 34 separate from each other are formed in the intermediate region 24. In other respects, the structure is the same as the example shown in FIG. 2.

The respective diode portions 58 connected to the source electrode 11 and the current detecting electrode 12 in the intermediate region 24 of the present example include the base regions 34 separate from each other. The p+-region 36 is formed in the base region 34 in each of the diode portions 58. The respective base regions 34 may be at least partially formed in regions not below the field plate 72.

Moreover, another base region 34 separate from the other base regions may be further formed between the base regions 34 of the respective diode portions 58. The respective base regions 34 may be formed by ion implantation and heat treatment.

The base regions 34 in the intermediate region 24 are arranged at the same intervals as the columns 60. Note that the p+-region 36 is not formed in the base region 34 that is connected to neither the source electrode 11 nor the current detecting electrode 12 in the intermediate region 24. The base region 34 where the p+-region 36 is not formed may be arranged below the field plate 72.

Such a structure also allows the columns 60 and the columns 62 of superjunction to be arranged at equal intervals while providing the intermediate region 24 separating the main body region 21 and the current detecting region 22. Accordingly, the charge balance between the p-type and n-type impurities in the superjunction can easily be kept, and the reverse breakdown voltage can be maintained.

Figure 4:
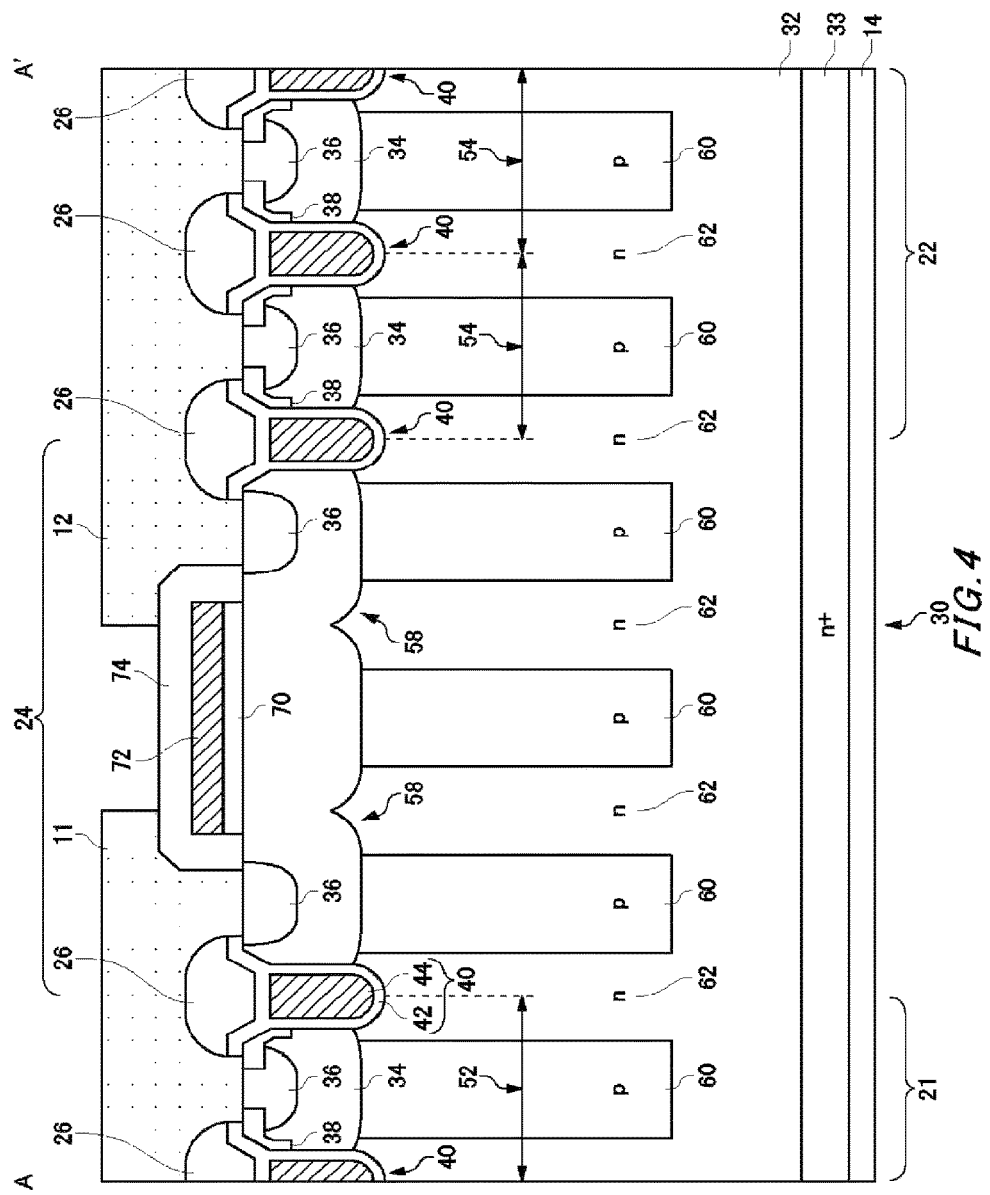
FIG. 4 shows another example of the cross section A-A' in FIG. 1.

FIG. 4 shows another example of the cross section A-A' in FIG. 1. In the present example, the respective base regions 34 in the intermediate region 24 shown in FIG. 3 are connected. Concavities and convexities are formed on the lower surface of the base region 34 of the present example by ion implantation and diffusion. However, parts of the base region 34 in the intermediate region 24 that protrude downward are arranged at the same intervals as the columns 60.

Such a structure also allows the columns 60 and the columns 62 of superjunction to be arranged at equal intervals while providing the intermediate region 24 separating the main body region 21 and the current detecting region 22. Accordingly, the charge balance between the p-type and n-type impurities in the superjunction can easily be kept, and the reverse breakdown voltage can be maintained.

Figure 5:
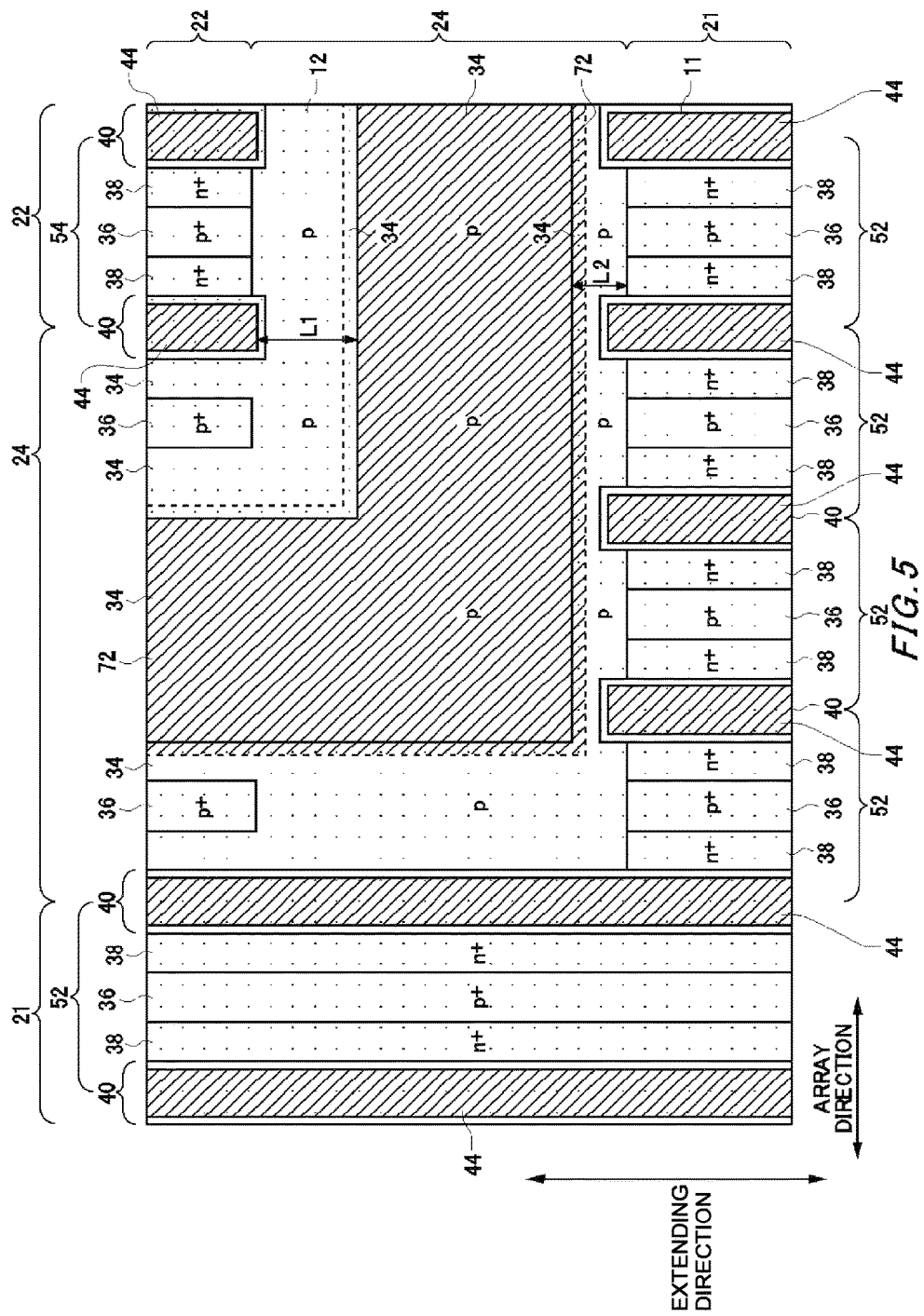
FIG. 5 is an enlarged schematic view of part B near a corner of a current detecting electrode 12 in FIG. 1.

FIG. 5 is an enlarged schematic view of part B near a corner of the current detecting electrode 12 on the upper surface of the semiconductor device 100 shown in FIG. 1. FIG. 5 corresponds to the structure shown in FIG. 2. FIG. 5 shows the trench portion 40, the electrode unit 44, the base region 34, the source region 38, the p+-region 36, the field plate 72, the source electrode 11, and the current detecting electrode 12, and the other structures are omitted.

The plurality of trench portions 40 are arranged at the constant intervals along a predetermined array direction in the main body region 21 and the current detecting region 22. The trench portion 40 of the present example is not formed in the intermediate region 24. The respective trench portions 40 are provided to extend along a predetermined extending direction.

The base region 34 is formed in the mesa region between the respective trench portions 40. However, in the main body region 21 and the current detecting region 22, the source region 38 and the p+-region 36 are formed to extend in stripe shapes along the extending direction on the upper surface of the semiconductor substrate 30. Alternatively, the source region 38 and the p+-region 36 may be alternately formed along the extending direction.

The intermediate region 24 is provided between the main body region 21 and the current detecting region 22 in both the extending direction and the array direction. The base region 34 is formed near the upper surface of the semiconductor substrate 30 in the intermediate region 24, and the field plate 72 is formed above the upper surface of the semiconductor substrate 30. The p+-region 36 may be formed along the extending direction near the border between the intermediate region 24 and another region in the array direction.

Also, the source region 38 is not formed in the intermediate region 24. Consequently, the source regions 38 in the main body region 21 and the current detecting region 22 are separated in the mesa region that is included in the main body region 21, the current detecting region 22, and the intermediate region 24 in the extending direction. In the mesa region where the main body region 21, the current detecting region 22, and the intermediate region 24 exist, a length L1 in the intermediate region 24 formed at the lower side of the current detecting electrode 12 may be greater than a length L2 in the intermediate region 24 formed at the lower side of the source electrode 11. This can reduce the area of the intermediate region 24 formed at the lower side of the source electrode 11.

Figure 6:
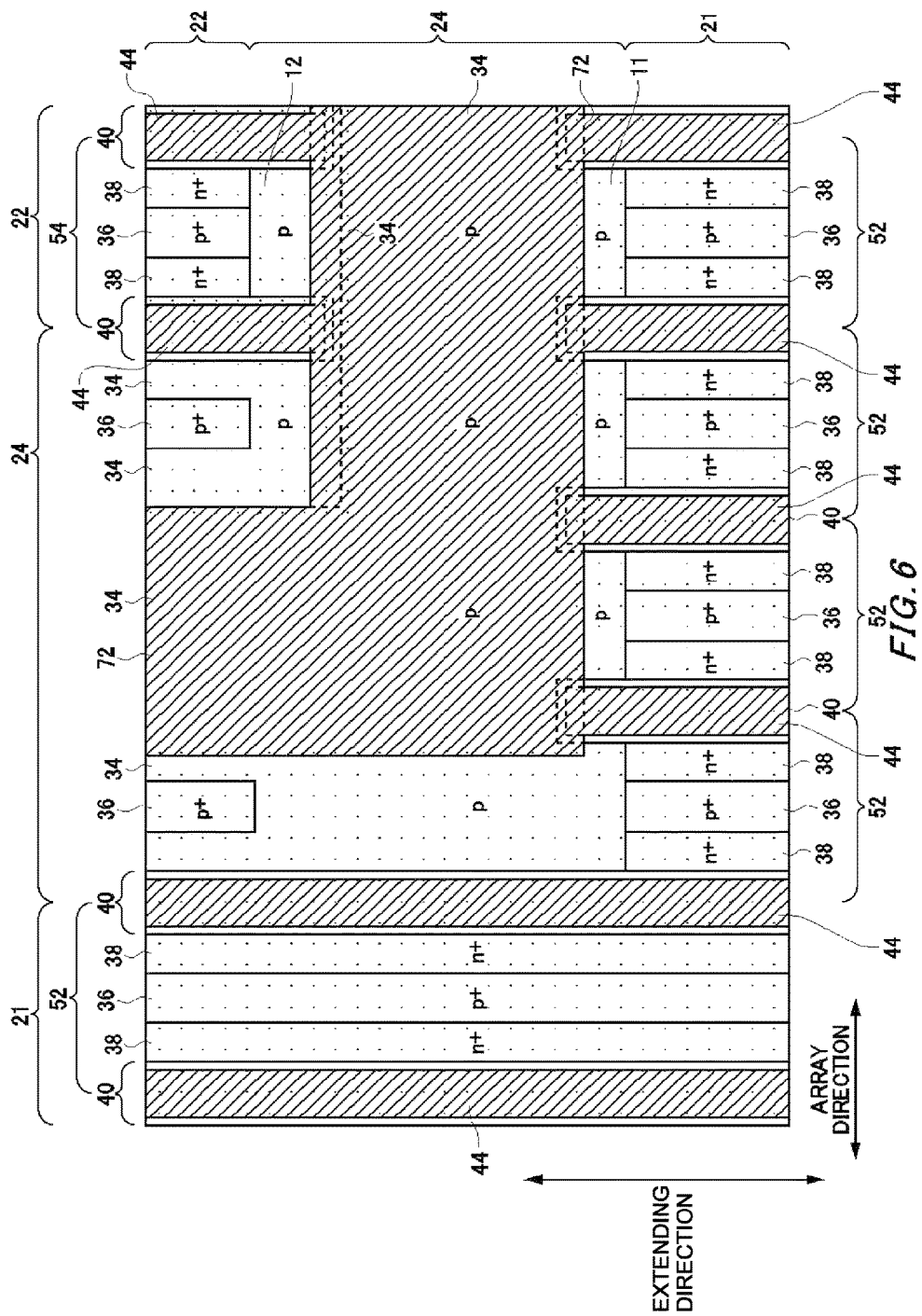
FIG. 6 is an enlarged schematic view of part B near a corner of a current detecting electrode 12 in FIG. 1.

FIG. 6 is an enlarged schematic view of part B near a corner of the current detecting electrode 12 on the upper surface of the semiconductor device 100. In the example of FIG. 6, the field plate 72 is formed simultaneously with the electrode unit 44 that is embedded via the gate insulating film 42 in the trench portion 40 in the operation cell 52 and the current detecting cell 54. Furthermore, the field plate 72 and the electrode unit 44 are connected in the direction parallel to the longitudinal direction (the extending direction in the drawing) of the trench portion 40. The electrode unit 44 is embedded via the gate insulating film 42 in the trench portion 40 in the operation cell 52 and the current detecting cell 54. In other respects, the structure is the same as FIG. 5, and the effects similar to those in the example of FIG. 5 can be achieved.

While the embodiment(s) of the present invention has (have) been described, the technical scope of the invention is not limited to the above described embodiment(s).

It is apparent to persons skilled in the art that various alterations and improvements can be added to the above-described embodiment(s).

It is also apparent from the scope of the claims that the embodiments added with such alterations or improvements can be included in the technical scope of the invention.

Note that the embodiments according to the present invention describe a trench gate structure including the gate insulating film 42 formed on the inner wall of the trench and the electrode unit 44 that is provided in the trench portion 40 and covered with the gate insulating film 42. Yet, the present invention may be applied to a planar gate structure including a base region selectively arranged in a surface layer of a semiconductor substrate and a source region selectively arranged in the base region. The planar gate structure also includes a gate insulating film arranged on the surface of the semiconductor substrate and an electrode unit on the gate insulating film.

Furthermore, the planar shapes of the base region 34 and the trench portion 40 are stripes as shown in FIG. 5 and FIG. 6. Yet, the planar shape of the base region 34 may be an island shape while the planar shape of the trench portion 40 may be a lattice shape arranged between the island shapes of the base regions 34, and the electrode unit 44 may be a lattice shape.

Similarly, also in the above-mentioned planar gate structure, the planar shape of the base region may be an island shape while the planar shape of the electrode unit may be a lattice shape arranged between the island shapes of the base regions.

Note that the planar shape of the p-type column is also arranged in an island shape when the base region is formed in an island shape.

EXPLANATION OF REFERENCES

11: source electrode; 12: current detecting electrode; 13: gate electrode; 14: drain electrode; 21: main body region;

22: current detecting region; 23: edge termination structure region; 24: intermediate region; 26: interlayer insulating film; 30: semiconductor substrate; 32: drift region; 33: drain region; 34: base region; 36: p+-region; 38: source region; 40: trench portion; 42: gate insulating film; 44: electrode unit; 52: operation cell; 54: current detecting cell; 58: diode portion; 60: column; 62: column; 70: insulating film; 72: field plate; 74: interlayer insulating film; 100: semiconductor device

What is claimed is:

1. A semiconductor device, comprising:
a semiconductor substrate;
a main body region having one or more operation cells formed inside the semiconductor substrate;
a current detecting region having one or more current detecting cells formed inside the semiconductor substrate; and
an intermediate region that is provided between the main body region and the current detecting region, wherein
first conductivity-type columns and second conductivity-type columns are alternately arranged at equal intervals in the main body region, the current detecting region, and the intermediate region,
in the intermediate region, a first diode portion is formed in a region adjacent to the main body region and a second diode portion is formed in a region adjacent to the current detecting region,
a plurality of first conductivity-type base regions are formed inside the semiconductor substrate,
the first diode portion adjacent to the main body region includes a first one of the plurality of base regions and the second diode portion adjacent to the current detecting region includes a second one of the plurality of base regions, the first and second one of the plurality of base regions being separate from each other, and
the intermediate region has a field plate formed above a plurality of base regions.

2. The semiconductor device according to claim 1, wherein
a second conductivity-type drift region is formed inside the semiconductor substrate, the drift region being formed below the plurality of base regions,
the main body region and the current detecting region have:
a plurality of trench portions that are formed to extend from an upper surface of the semiconductor substrate to below the plurality of base regions and arranged at same intervals; and
a second conductivity-type high concentration region formed above the plurality of base regions in a region between the respective trench portions, and
the high concentration region is not formed in the intermediate region.

3. The semiconductor device according to claim 2, wherein
the intermediate region further has, between the first base region in the first diode portion adjacent to the main body region and the second base region in the second diode portion adjacent to the current detecting region, a third one of the plurality of base regions separate from the first and second one of the plurality of base regions.

4. The semiconductor device according to claim 1, further comprising:
an upper surface side electrode formed above at least part of the main body region; and
a current detecting electrode formed above at least part of the current detecting region, wherein
the first diode portion adjacent to the main body region is connected to the upper surface side electrode, and
the second diode portion adjacent to the current detecting region is connected to the current detecting electrode.

5. The semiconductor device according to claim 1, wherein
the first conductivity-type columns and the second conductivity-type columns have same impurity concentration in the main body region, the current detecting region, and the intermediate region.

6. A semiconductor device, comprising:
a semiconductor substrate;
a main body region having one or more operation cells formed inside the semiconductor substrate;
a current detecting region having one or more current detecting cells formed inside the semiconductor substrate; and
an intermediate region that is provided between the main body region and the current detecting region, wherein
first conductivity-type columns and second conductivity-type columns are alternately arranged at equal intervals in the main body region, the current detecting region, and the intermediate region,
in the intermediate region, a first diode portion is formed in a region adjacent to the main body region and a second diode portion is formed in a region adjacent to the current detecting region,
a first conductivity-type base region is formed inside the semiconductor substrate, and
the first diode portion adjacent to the main body region and the second diode portion adjacent to the current detecting region share the base region.

7. The semiconductor device according to claim 6, wherein
the intermediate region has a field plate formed above the base region.

8. The semiconductor device according to claim 7, wherein
a second conductivity-type drift region is formed inside the semiconductor substrate, the drift region being formed below the base region,
the main body region and the current detecting region have:
a plurality of trench portions that are formed to extend from an upper surface of the semiconductor substrate to below the base region and arranged at same intervals; and
a second conductivity-type high concentration region formed above the base region in a region between the respective trench portions, and
the high concentration region is not formed in the intermediate region.

* * * * *